(12) United States Patent
Lee et al.

(10) Patent No.: US 10,965,271 B2
(45) Date of Patent: Mar. 30, 2021

(54) ACOUSTIC RESONATOR AND METHOD FOR FABRICATING THE SAME

(71) Applicant: SAMSUNG ELECTRO-MECHANICS CO., LTD., Suwon-si (KR)

(72) Inventors: Tae Kyung Lee, Suwon-si (KR); Jun Lim, Suwon-si (KR); Jong Woon Kim, Suwon-si (KR); Ran Hee Shin, Suwon-si (KR); Sung Sun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 532 days.

(21) Appl. No.: 15/875,207

(22) Filed: Jan. 19, 2018

(65) Prior Publication Data

US 2018/0351533 A1     Dec. 6, 2018

(30) Foreign Application Priority Data

May 30, 2017 (KR) .................. 10-2017-0066487
Aug. 16, 2017 (KR) .................. 10-2017-0103830

(51) Int. Cl.
*H03H 9/17* (2006.01)
*H03H 3/02* (2006.01)
*H03H 9/13* (2006.01)
*H03H 9/02* (2006.01)

(52) U.S. Cl.
CPC ............. *H03H 9/174* (2013.01); *H03H 3/02* (2013.01); *H03H 9/02086* (2013.01); *H03H 9/131* (2013.01); *H03H 9/173* (2013.01); *H03H 2003/021* (2013.01); *H03H 2003/023* (2013.01)

(58) Field of Classification Search
CPC .... H03H 9/174; H03H 9/173; H03H 9/02086; H03H 3/02; H03H 9/131; H03H 2003/021; H03H 2003/023; H03H 9/171
See application file for complete search history.

(56) References Cited

U.S. PATENT DOCUMENTS

| | | | |
|---|---|---|---|
| 8,830,012 B2 | 9/2014 | Pang et al. | |
| 10,298,201 B2* | 5/2019 | Kim | H03H 9/02133 |
| 2003/0193269 A1* | 10/2003 | Jang | H03H 9/173 |
| | | | 310/346 |
| 2003/0231851 A1 | 12/2003 | Rantala et al. | |
| 2005/0148205 A1* | 7/2005 | Franosch | B81C 1/00333 |
| | | | 438/783 |
| 2010/0097431 A1* | 4/2010 | Takakuwa | B41J 2/14233 |
| | | | 347/68 |
| 2011/0073474 A1 | 3/2011 | Cho et al. | |
| 2011/0304412 A1 | 12/2011 | Zhang | |

(Continued)

FOREIGN PATENT DOCUMENTS

KR     10-2011-0033521 A     3/2011

*Primary Examiner* — Emily P Pham
(74) *Attorney, Agent, or Firm* — NSIP Law

(57) ABSTRACT

An acoustic resonator includes a membrane layer disposed on an insulating layer; a cavity formed by the insulating layer and the membrane layer; a resonating portion disposed on the cavity and having a first electrode, a piezoelectric layer, and a second electrode stacked thereon; a protective layer disposed on the resonating portion; and a hydrophobic layer formed on the protective layer.

8 Claims, 15 Drawing Sheets

(56) References Cited

U.S. PATENT DOCUMENTS

| | | | | |
|---|---|---|---|---|
| 2013/0049545 A1* | 2/2013 | Zou | ........................ | H03H 9/175 |
| | | | | 310/346 |
| 2014/0292143 A1* | 10/2014 | Ichikawa | ............. | H03H 9/1021 |
| | | | | 310/311 |
| 2014/0339959 A1* | 11/2014 | Lee | ........................ | H01L 41/332 |
| | | | | 310/348 |
| 2015/0318837 A1* | 11/2015 | Zou | ........................ | H03H 3/013 |
| | | | | 333/187 |
| 2016/0163954 A1* | 6/2016 | Shin | ........................ | H03H 3/02 |
| | | | | 310/311 |

* cited by examiner

ACOUSTIC RESONATOR AND METHOD FOR FABRICATING THE SAME

CROSS-REFERENCE TO RELATED APPLICATIONS

This application claims the benefit under 35 USC 119(a) of Korean Patent Application No. 10-2017-0066487 filed on May 30, 2017, in the Korean Intellectual Property Office, the entire disclosure of which is incorporated herein by reference for all purposes, and Korean Patent Application No. 10-2017-0103830 filed on Aug. 16, 2017, in the Korean Intellectual Property Office, the entire disclosure of which is incorporated herein by reference for all purposes.

BACKGROUND

1. Field

This application relates to an acoustic resonator and a method for manufacturing the same.

2. Description of the Background

In accordance with a rapid development of mobile communications devices, chemical and biological testing devices, and the like, demand for compact and lightweight filters, oscillators, resonant elements, acoustic resonant mass sensors, and the like, has recently increased.

As a means of implementing such compact and lightweight filters, oscillators, resonant elements, acoustic resonant mass sensors, and the like, a film bulk acoustic resonator (FBAR) may be utilized.

FBARs may be mass produced at low cost and FBARs may be subminiaturized. Further, FBARs may provide a high quality factor Q value, a main property of a filter, may be used even in a micro-frequency band, and may particularly allow for use with personal communications system (PCS) and digital cordless system (DCS) bands.

In general, the FBAR has a structure including a resonating portion implemented by a first electrode, a piezoelectric layer, and a second electrode stacked in sequence on a substrate.

An operational principle of the FBAR includes inducing an electric field in the piezoelectric layer by applying electric energy to the first and second electrodes. The electric field causes a piezoelectric phenomenon of the piezoelectric layer, thereby causing the resonating portion to vibrate in a predetermined direction. As a result, a bulk acoustic wave is generated in the same direction as the vibration direction of the resonating portion, thereby causing resonance.

That is, the FBAR, an element using bulk acoustic waves (BAWs), may improve frequency characteristics of a BAW element and may also be implemented in a wideband, as an effective electromechanical coupling coefficient ($kt^2$) of the piezoelectric layer is increased.

The above information disclosed in this Background section is only for enhancement of understanding of the background of the disclosure and therefore it may contain information that does not form any part of the prior art nor what the prior art may suggest to a person of ordinary skill in the art.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes a membrane layer disposed on an insulating layer, a cavity formed by the insulating layer and the membrane layer, a resonating portion disposed on the cavity and having a first electrode, a piezoelectric layer, and a second electrode stacked thereon, a protective layer disposed on the resonating portion; and a hydrophobic layer disposed on the protective layer.

The hydrophobic layer may be further disposed on an upper surface of the cavity. The hydrophobic layer may be further disposed on at least a portion of a lower surface and a side surface of the cavity. The hydrophobic layer may be a self-assembled monolayer. The hydrophobic layer may include a fluorine (F) component. The hydrophobic layer may further include a silicon (Si) component.

The resonating portion may include a center portion, and an extending portion extending outward from the center portion and in which an insertion layer is disposed below the piezoelectric layer. The piezoelectric layer may include a piezoelectric portion disposed in the center portion, and a bending portion disposed in the extending portion and extending inclined from the piezoelectric portion along an inclined surface of the insertion layer.

In another general aspect, a method for manufacturing an acoustic resonator includes disposing a sacrificial layer on an insulating layer and forming a pattern penetrating through the sacrificial layer; disposing a membrane layer on the sacrificial layer; stacking a first electrode, a piezoelectric layer, and a second electrode on the membrane layer to form a resonating portion; removing a portion of the sacrificial layer to form a cavity; disposing a protective layer on the resonating portion; and disposing a hydrophobic layer on the protective layer.

Disposing the hydrophobic layer may include disposing a fluorocarbon functional group on the protective layer. Disposing the hydrophobic layer may include surface-treating the protective layer using a precursor having a silicon head before forming the hydrophobic layer.

The method for manufacturing an acoustic resonator may further include disposing the hydrophobic layer on an upper surface of the cavity. The method may further include disposing the hydrophobic layer on at least a portion of a lower surface and a side surface of the cavity.

The hydrophobic layer may be a self-assembled monolayer.

The method may further include trimming before disposing the hydrophobic layer.

Forming the resonating portion may include forming a first electrode on the membrane layer, forming a piezoelectric layer including a piezoelectric portion stacked on the first electrode layer and a bending portion extending inclined from a boundary of the piezoelectric portion, and forming a second electrode on the piezoelectric layer.

The method for manufacturing an acoustic resonator may further include, before disposing the piezoelectric layer, disposing an insertion layer below the bending portion, and the bending portion may have an inclined surface along an inclined surface of the insertion layer.

In another general aspect, an acoustic resonator includes a membrane layer disposed on an insulating layer, a cavity formed by the insulating layer and the membrane layer, and a resonating portion disposed on the cavity including a first electrode, a piezoelectric layer comprising an inclined portion disposed on the first electrode, and a second electrode disposed on the piezoelectric layer. The second electrode comprises an end portion extending partway along the inclined portion.

The acoustic resonator may further include a protective layer disposed on the resonating portion. The acoustic resonator may further include a hydrophobic layer disposed on the protective layer.

The inclined portion has a length $I_s$ and the end portion extends along the inclined portion a distance $W_e$, and $W_e/I_s$ may be greater than 0.2 and less than 0.9.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

An aspect of the present disclosure may provide a solution for a problem that frequency fluctuation is increased or performance of a resonator is degraded due to a hydroxy group (OH group) adsorbed onto a protective layer of an acoustic resonator when the acoustic resonator is used in a humid environment or left at room temperature for a long time.

Acoustic Resonator

Figure 1:
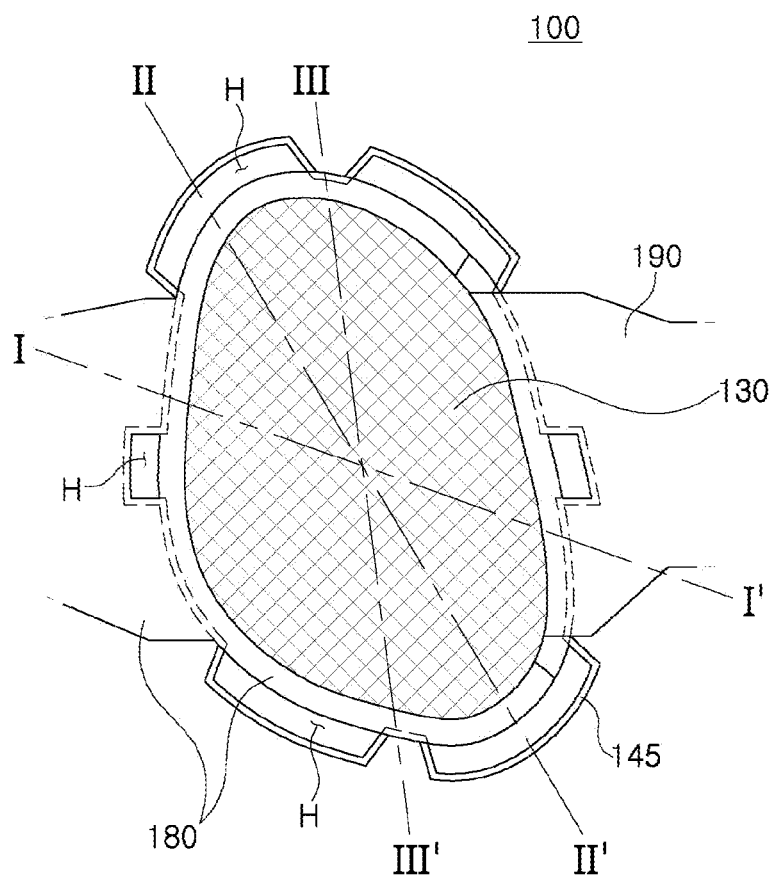
FIG. 1 is a plan view of a first example of an acoustic resonator.
Figure 2:
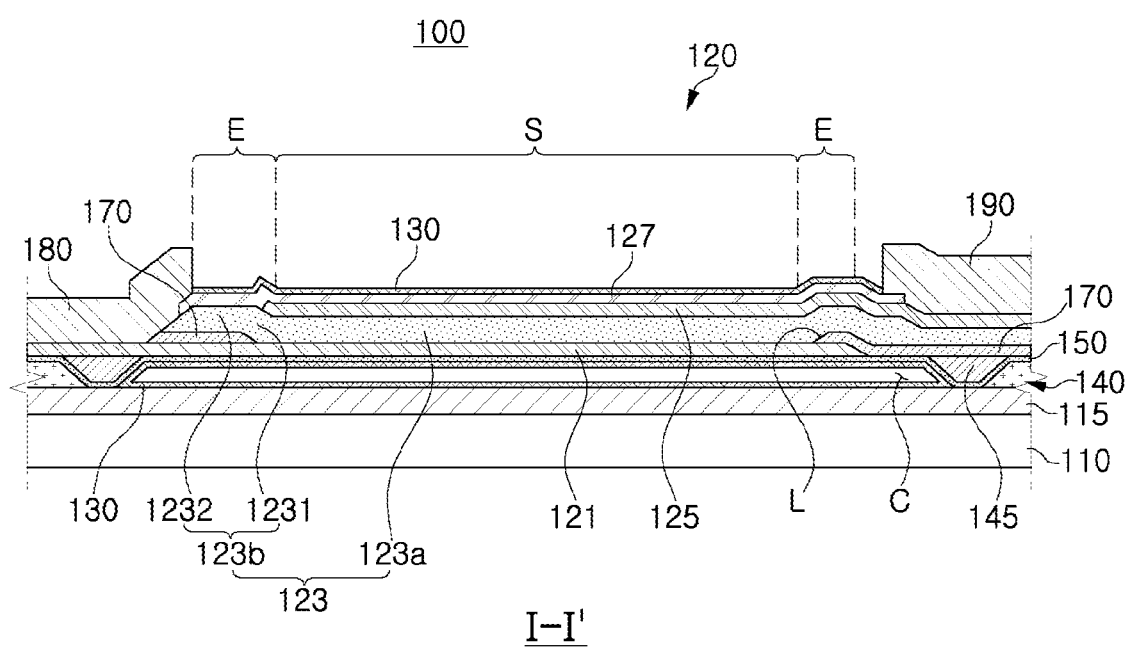
FIG. 2 is a cross-sectional view taken along a line I-I' of FIG. 1.
Figure 3:
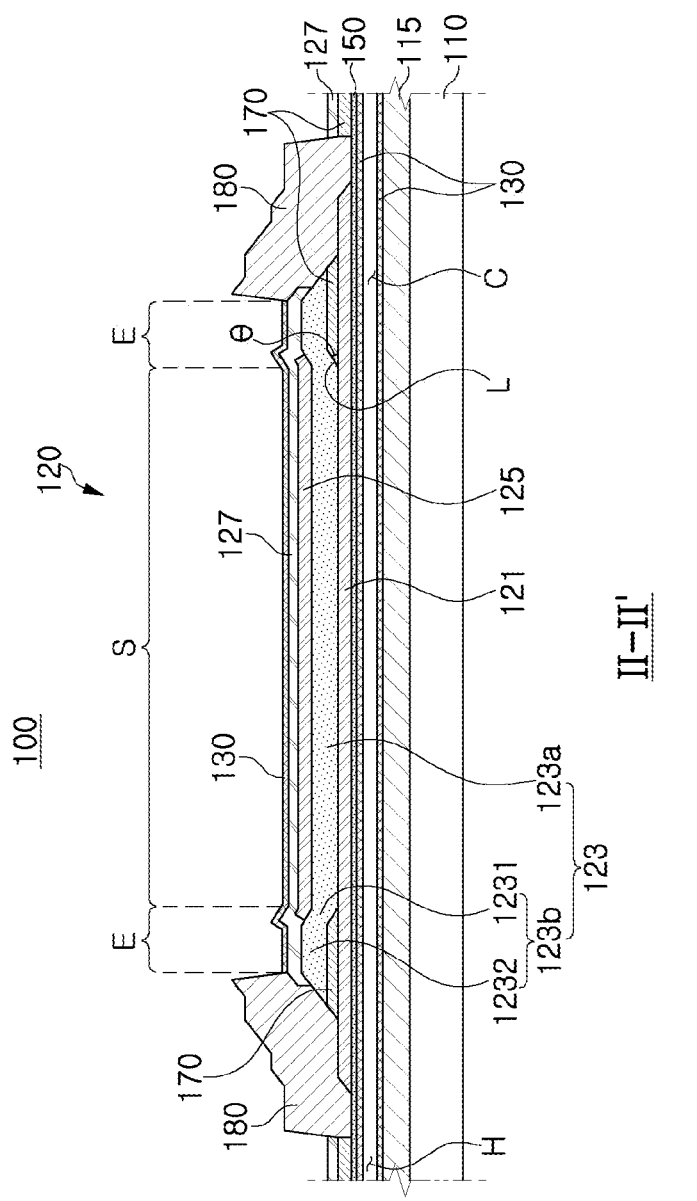
FIG. 3 is a cross-sectional view taken along a line II-II' of FIG. 1.
Figure 4:
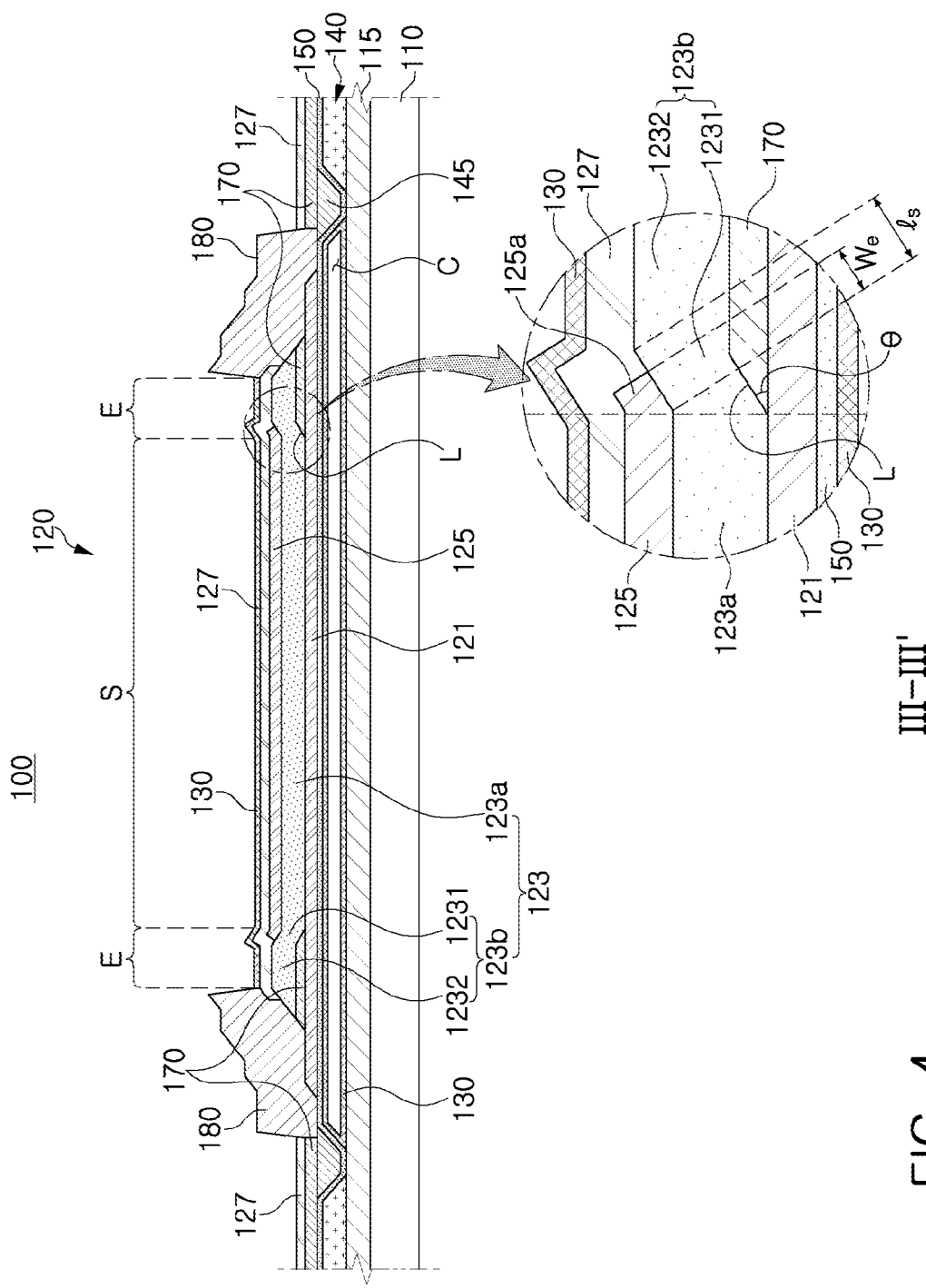
FIG. 4 is a cross-sectional view taken along a line III-III' of FIG. 1.

FIG. 1 is a plan view of a first example of an acoustic resonator according to an exemplary embodiment in the present disclosure and FIG. 2 is a cross-sectional view taken along a line I-I' of FIG. 1. Further, FIG. 3 is a cross-sectional view taken along a line II-II' of FIG. 1 and FIG. 4 is a cross-sectional view taken along a line III-III' of FIG. 1.

Referring to FIGS. 1 through 4, the first example of an acoustic resonator 100 is a film bulk acoustic resonator (FBAR) and includes a substrate 110, an insulating layer 115, a membrane layer 150, a cavity C, a resonating portion 120, a protective layer 127, and a hydrophobic layer 130.

The substrate 110 may be a silicon substrate. For example, as the substrate 110, a silicon wafer may be used, or a silicon on insulator (SOI) type of substrate may be used.

The insulating layer 115 formed on the substrate 110 electrically isolates the substrate 110 and the resonating portion 120 from each other. Further, the insulating layer 115 prevents the substrate 110 from being etched by etching gas, when forming the cavity C in a process of manufacturing of the acoustic resonator.

In this case, the insulating layer 115 may be formed of at least one of silicon dioxide ($SiO_2$), silicon nitride ($Si_3N_4$), aluminum oxide ($Al_2O_3$), and aluminum nitride (AlN) and may be formed on the substrate 110 by any one of chemical vapor deposition, RF magnetron sputtering, and evaporation.

A sacrificial layer 140 is formed on the insulating layer 115, and the cavity C and an etching stop part 145 is disposed in the sacrificial layer 140.

The cavity C may be formed as air and may be formed by removing a portion of the sacrificial layer 140.

As the cavity C is formed in the sacrificial layer 140, the resonating portion 120 formed on the sacrificial layer 140 is substantially flat.

The etching stop part 145 may be disposed along a boundary of the cavity C. The etching stop part 140 may be provided to prevent the cavity C from being etched beyond a cavity region in the process of forming the cavity C. Therefore, a horizontal area of the cavity C may be defined by the etching stop part 145 and a vertical area of the cavity C may be defined by a thickness of the sacrificial layer 140.

The membrane layer 150 is disposed on the sacrificial layer 140 and defines a thickness (or a height as viewed in FIGS. 2 through 4) of the cavity C together with the insulating layer 115. Therefore, the membrane layer 150 includes a material which is not easily removed in a process of forming the cavity C.

For example, in a case in which halide-based etching gases such as fluorine (F), chlorine (Cl), and the like are used to remove a portion (for example, a cavity region) of the sacrificial layer 140, the membrane layer 150 may be formed of a material having low reactivity with these etching gases. In this case, the membrane layer 150 may include at least one of silicon dioxide ($SiO_2$) and silicon nitride ($Si_3N_4$).

Further, the membrane layer 150 may include a dielectric layer containing at least one material of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or may be formed of a metal layer containing at least one material of aluminum (Al), nickel (Ni), chromium (Cr), platinum (Pt), gallium (Ga), and hafnium (Hf). However, the configuration of the present disclosure is not limited thereto.

A seed layer (not shown) formed of aluminum nitride (AlN) may be formed on the membrane layer 150. Specifically, the seed layer may be disposed between the membrane layer 150 and a first electrode 121. The seed layer may be formed of a dielectric or a metal having a hexagonal-close-packed (HCP) structure other than AlN. In a case in which the seed layer is formed of the metal, the seed layer may be formed of, for example, titanium (Ti).

The resonating portion 120 includes a first electrode 121, a piezoelectric layer 123, and a second electrode 125. The resonating portion 120 may be formed by stacking the first electrode 121, the piezoelectric layer 123, and the second electrode 125 in sequence from below. Therefore, in the resonating portion 120, the piezoelectric layer 123 may be disposed between the first electrode 121 and the second electrode 125.

Since the resonating portion 120 is formed on the membrane layer 150, the resonating portion 120 may be formed by stacking the membrane layer 150, the first electrode 121, the piezoelectric layer 123, and the second electrode 125 in sequence on the substrate 110.

The resonating portion 120 allows the piezoelectric layer 123 to resonate in response to first signals applied to the first electrode 121 and the second electrode 125 to generate a resonance frequency and to anti-resonate in response to second signals applied to the first electrode 121 and he second electrode 125 to generate an anti-resonance frequency.

In a case in which an insertion layer 170, to be described below, is formed, the resonating portion 120 may be classified into a center portion S on which the first electrode 121, the piezoelectric layer 123, and the second electrode 125 are stacked to be substantially flat, and an extending portion E, in which the insertion layer 170 is interposed between the first electrode 121 and the piezoelectric layer 123.

The center portion S is a region disposed at a center of the resonating portion 120 and the extending portion E is a region disposed along a perimeter of the center portion S. Therefore, the extending portion E refers to a region extending outwardly from the center portion S.

The insertion layer 170 includes an inclined surface L by which thickness of the insertion layer is increased as a distance from the center portion S is increased.

In the extending portion E, the piezoelectric layer 123 and the second electrode 125 are disposed on the insertion layer 170. Therefore, the piezoelectric layer 123 and the second electrode 125 disposed in the extending portion E include inclined surfaces along the inclined surface L of the insertion layer 170. The inclined surface L forms an edge of the insertion layer 170 extending toward the center portion S.

The extending portion E is included in the resonating portion 120, and resonance may also occur in the extending portion E, accordingly. However, the occurrence of resonance is not limited thereto, and resonance may not occur in the extending portion E depending on a structure of the extending portion E, and hence, may occur in only the center portion S.

The first electrode 121 and the second electrode 125 may be formed of an electrical conductor, and may be formed of, for example, gold, molybdenum, ruthenium, iridium, aluminum, platinum, titanium, tungsten, palladium, tantalum, chromium, nickel, or a metal including at least one thereof, but are not limited thereto.

The first electrode 121 may have a wider area than the second electrode 125 and a first metal layer 180 may be disposed on the first electrode 121 along an outer portion of the first electrode 121. Therefore, the first metal layer 180 may be disposed to surround the second electrode 125.

Since the first electrode 121 is disposed on the membrane layer 150, it may be generally flat. On the other hand, since the second electrode 125 may be disposed on the piezoelectric layer 123, the second electrode 125 may have a bending formed to correspond to a shape of the piezoelectric layer 123.

The second electrode 125 may be entirely disposed in the center portion S and may be partially disposed in the extending portion E. Accordingly, the second electrode 125 may be classified into a portion disposed on a piezoelectric portion 123a of the piezoelectric layer 123 and a bending portion 123b of the piezoelectric layer 123 which are described in more detail below.

For example, the second electrode 125 may be disposed to cover the entirety of the piezoelectric portion 123a and a portion of an inclined portion 1231 of the bending portion 123b of the piezoelectric layer 123. Therefore, a portion of the second electrode 125a disposed in the extending portion E may have a smaller area than an inclined surface of the inclined portion 1231, and the second electrode 125 in the resonating portion 120 may have a smaller area than the piezoelectric layer 123.

The piezoelectric layer 123 may be formed on the first electrode 121. In a case in which the insertion layer 170, to be described below, is formed, the piezoelectric layer 123 may be formed on the first electrode 121 and the insertion layer 170.

The material of the piezoelectric layer 123 includes, for example, zinc oxide (ZnO), aluminum nitride (AlN), doped aluminum nitride, lead zirconate titanate, quartz, and the like. For example, the doped aluminum nitride may further include a rare earth metal or a transition metal. As an example, the rare earth metal may include at least one of scandium (Sc), erbium (Er), yttrium (Y), cerium (Ce), and lanthanum (La). The transition metal may include at least one of hafnium (Hf), titanium (Ti), zirconium (Zr), tantalum (Ta), niobium (Nb), and magnesium (Mg).

The piezoelectric layer 123 may include a piezoelectric portion 123a disposed on the center portion S and a bending portion 123b disposed on the extending portion E.

The piezoelectric portion 123a is a portion which is directly disposed on a top surface of the first electrode 121. Therefore, the piezoelectric portion 123a is interposed between the first electrode 121 and the second electrode 125 to form a flat structure together with the first electrode 121 and the second electrode 125.

The bending portion 123b is a region which is extended outwardly from the piezoelectric portion 123a and disposed in the extending portion E.

The bending portion 123b is disposed on the insertion layer 170, to be described below, and is formed to be uplifted along an edge of the insertion layer 170. Accordingly, the piezoelectric layer 123 may be bent at a boundary between the piezoelectric portion 123a and the bending portion 123b, and the bending portion 123b may be uplifted to correspond to a thickness and an edge of the insertion layer 170.

The bending portion 123b may be classified into an inclined portion 1231 and a spreading portion 1232.

The inclined portion 1231 refers to a portion formed to be inclined along the inclined surface L of the insertion layer 170, to be further described below. In addition, the spreading portion 1232 refers to a portion which is extended outwardly from the inclined portion 1231.

The inclined portion 1231 is parallel to the inclined surface L of the insertion layer 170, and an inclined angle of the inclined portion 1231 may be the same as an inclined angle (θ in FIG. 4) of the inclined surface L of the insertion layer 170.

The insertion layer 170 is disposed along a surface formed by the membrane layer 150, the first electrode 121, and the etching stop part 145.

The insertion layer 170 may be disposed around the center portion S to support the bending portion 123b of the piezoelectric layer 123. Therefore, the bending portion 123b of the piezoelectric layer 123 may be classified into the inclined portion 1231 and the spreading portion 1232 depending on the shape of the insertion layer 170.

The insertion layer 170 may be disposed on a region other than the center portion S. For example, the insertion layer 170 may be disposed on the entire region other than the center portion S or a partial region other than the center portion S.

Further, at least a portion of the insertion layer 170 may be disposed between the piezoelectric layer 123 and the first electrode 121.

The insertion layer 170 disposed along a boundary of the center portion S has a side surface where a thickness of the insertion layer 170 is increased as a distance from the center portion S is increased. Thereby, the side surface of the insertion layer 170 disposed to be adjacent to the center portion S is an inclined surface L having a constant inclined angle θ.

In a case in which the inclined angle θ of the side surface L of the insertion layer 170 is less than 5°, in order to manufacture the insertion layer 170, since the thickness of the insertion layer 170 needs to be extremely thin or an area of the inclined surface L needs to be extremely large, it is difficult to substantially implement the insertion layer 170.

Further, in a case in which the inclined angle θ of the side surface of the insertion layer 170 is greater than 70°, the inclined angle θ of the inclined portion 1231 of the piezoelectric layer 123 stacked on the insertion layer 170 may also be greater than 70°. In this case, since the piezoelectric layer 123 is excessively bent, a crack may occur from a bent portion of the piezoelectric layer 123.

Therefore, the inclined angle θ of the inclined surface L may have the range of greater than or equal to 5° and less than or equal to 70°.

The insertion layer 170 may include a dielectric material such as silicon dioxide ($SiO_2$), aluminum nitride (AlN), aluminum oxide ($Al_2O_3$), silicon nitride ($Si_3N_4$), magnesium oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material different from the piezoelectric layer 123. Further, a region including the insertion layer 170 may also be formed as air, as needed. This air may be implemented by forming the entirety of the resonating portion 120 and then removing the insertion layer 170 in the manufacturing process to leave a space in the shape of the illustrated insertion layer 170 bounded below by the first electrode 121 and bounded above by the inclined portion 1231 and spreading portion 1232 of the bending portion 123b of the piezoelectric layer 123.

According to the first example, the thickness of the insertion layer 170 may be the same as or similar to the thickness of the first electrode 121. Further, the insertion layer 170 thickness may be similar to or less than the piezoelectric layer 123 thickness. For example, the insertion layer 170 may have a thickness of 100 Å or more, but may be thinner than the thickness of the piezoelectric layer 123. However, the configuration of the present example is not limited thereto.

The resonating portion 120 according to the present example configured as described above may be spaced apart from the substrate 110 through the cavity C formed as air.

The cavity C may be formed by supplying an etching gas (or etching solution) into an injection hole H (FIGS. 1 and 3) to remove a portion of the sacrificial layer 140 in the process of manufacturing the acoustic resonator.

The protective layer 127 may be disposed along a surface of the acoustic resonator 100 and may protect the acoustic resonator 100 from the outside. The protective layer 127 may be disposed along a surface formed by the second electrode 125, the bending portion 123b of the piezoelectric layer 123, and the insertion layer 170.

The protective layer 127 may be formed of an insulating material including any of silicon oxide based insulating material, silicon nitride based insulating material, aluminum oxide based insulating material, and aluminum nitride based insulating material, but is not limited thereto.

The first electrode 121 and the second electrode 125 may be extended externally from the resonating portion 120, and a first metal layer 180 and a second metal layer 190 are disposed on upper surfaces of the externally extended portions of the first electrode 121 and the second electrode 125, respectively.

The first metal layer 180 and the second metal layer 190 may be formed of metal materials such as gold (Au), a gold-tin (Au—Sn) alloy, copper (Cu), a copper-tin (Cu—Sn) alloy, and the like.

The first metal layer 180 and the second metal layer 190 may serve as connection wirings that electrically connect the electrodes 121 and 125 of the acoustic resonator with electrodes of another acoustic resonator disposed to be adjacent to the acoustic resonator, or may serve as external connection terminals. However, the first metal layer 180 and the second metal layer 190 are not limited thereto.

Figure 9:
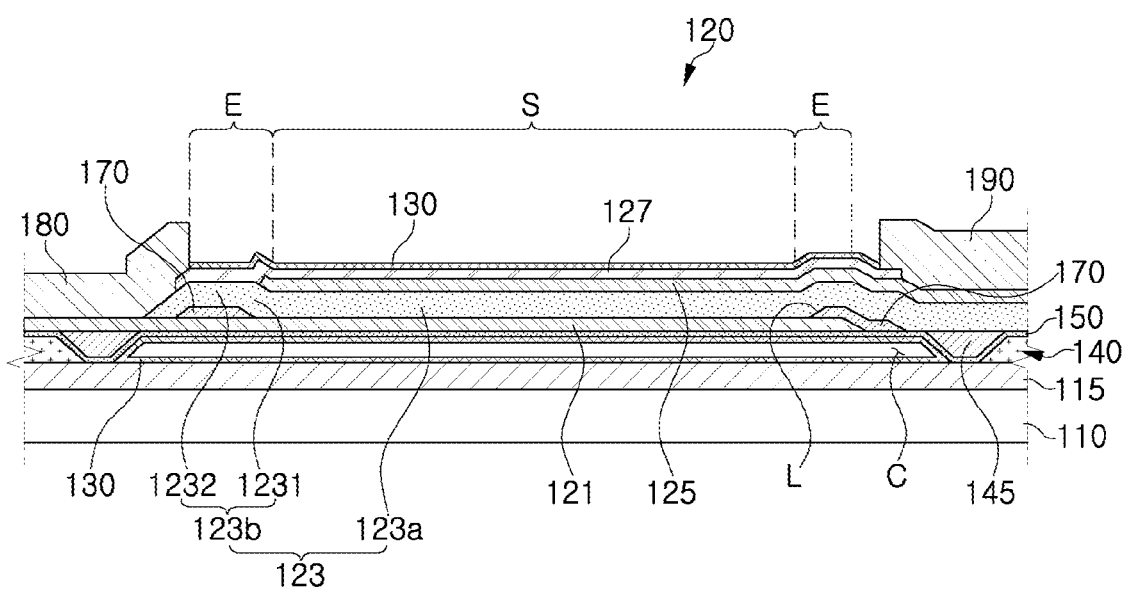
FIGS. 9 and 10 are cross-sectional views schematically illustrating a second example of an acoustic resonator.
Figure 10:
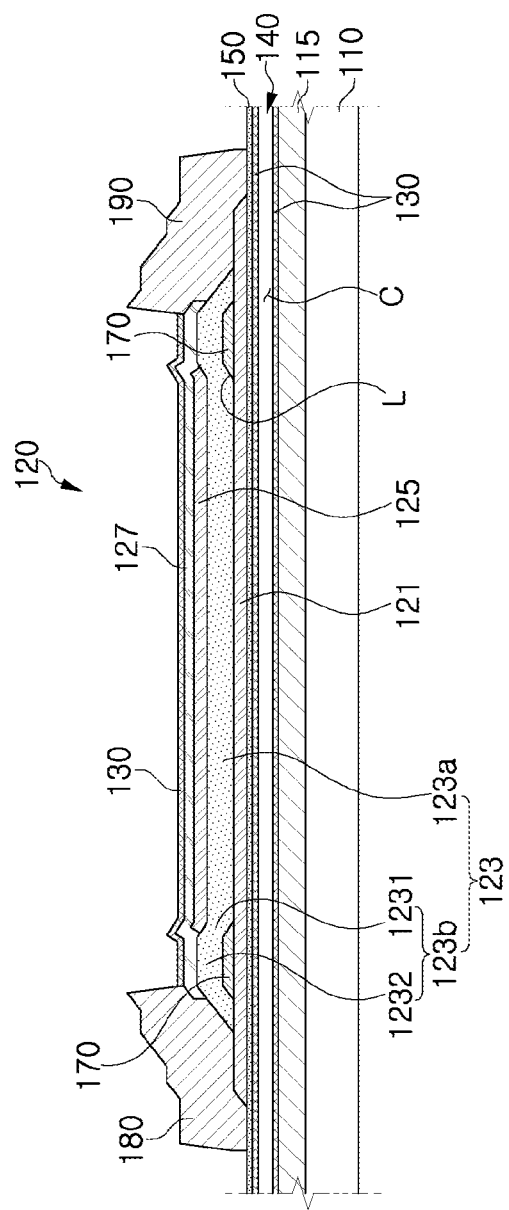

Although FIG. 2 illustrates a case in which the insertion layer 170 is disposed below the second metal layer 190, the configuration of the present disclosure is not limited thereto, but a structure in which the insertion layer 170 is removed below the second metal layer 190 may also be implemented as needed. For example, FIGS. 9 and 10 show a second example of an acoustic resonator including the insertion layer 170 removed below the first metal layer 180 and the second metal layer 190.

The first metal layer 180 may penetrate through the insertion layer 170 and the protective layer 127 and be coupled to the first electrode 121.

Further, as illustrated in FIG. 3, the first electrode 121 may have a wider area than the second electrode 125, and the first metal layer 180 may be formed around the first electrode 121.

Therefore, the first metal layer 180 may be disposed along a perimeter of the resonating portion 120 and disposed to surround the second electrode 125 accordingly. However, the first metal layer 180 is not limited thereto.

As described above, the second electrode 125 is disposed on the piezoelectric portion 123a and the inclined portion 1231 of the piezoelectric layer 123. In addition, a portion 125a (FIG. 4) of the second electrode 125 disposed on the inclined portion 1231 of the piezoelectric layer 123, that is, the portion of second electrode 125a disposed on the extending portion E may be disposed on only a portion of the inclined surface of the inclined portion 1231 of the piezoelectric layer 123, not the entirety of the inclined surface of the inclined portion 1231.

Figure 11:
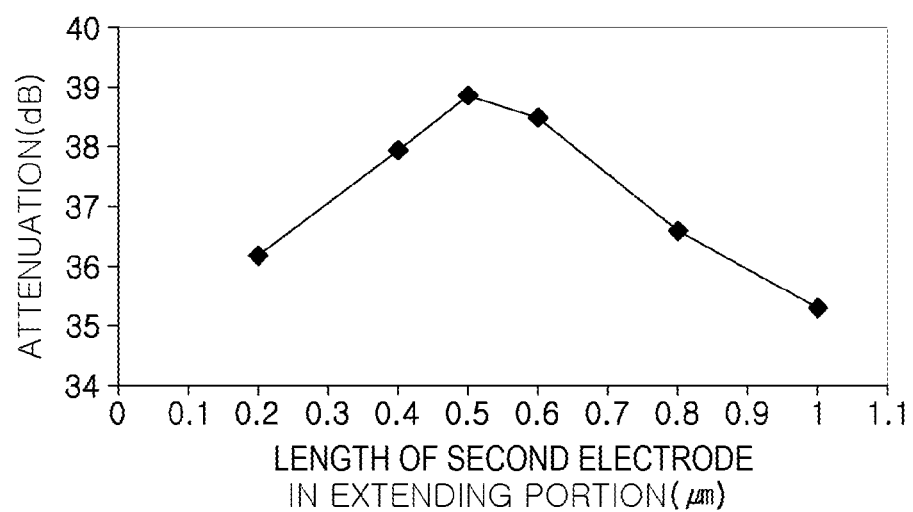
FIG. 11 is a graph illustrating resonance attenuation of the acoustic resonator according to a second electrode structure of the acoustic resonator.

FIG. 11 is a graph illustrating resonance attenuation of the acoustic resonator according to the second electrode 125 structure of the example acoustic resonator 100.

FIG. 11 is a graph obtained by measuring attenuation of an acoustic resonator while changing a size of the portion of second electrode 125a disposed in the extending portion E, in the acoustic resonator 100 in which the thickness of the insertion layer 170 is 3000 Å, the inclined angle θ of the inclined surface L of the insertion layer 170 is 20°, a length of the inclined surface L is 0.87 μm, which is the first example of an acoustic resonator 100 illustrated in FIGS. 2 and 3. Table 1 below summarizes values of the graph illustrated in FIG. 11.

TABLE 1

| Length (μm) of Portion of Second Electrode in Extending Portion | Attenuation(dB) | Length (μm) of Portion of Second Electrode in Extending Portion $W_e$/Length (μm) of Inclined Portion 1231 Surface $I_s$ |
| --- | --- | --- |
| 0.2 | 36.201 | 0.23 |
| 0.4 | 37.969 | 0.46 |
| 0.5 | 38.868 | 0.575 |
| 0.6 | 38.497 | 0.69 |
| 0.8 | 36.64 | 0.92 |
| 1 | 35.33 | 1.149 |

※ length of inclined surface L = 0.87 μm

Since the inclined surface of the piezoelectric layer 123 is formed in the same shape along the inclined surface L of the insertion layer 170, the length $I_s$ of the inclined surface of the piezoelectric layer 123 is the same as the length of the inclined surface L of the insertion layer.

Referring to FIG. 11 and Table 1, in the acoustic resonator in which the length $I_s$ of the inclined surface of the inclined portion 1231 of the piezoelectric layer 123 in the extending portion E is 0.87 μm, it was measured that attenuation was lowest when the length of the portion of the second electrode 125a, $W_e$ was 0.5 μm. In addition, in a case in which the length of the portion of the second electrode 125a in the extending portion E is greater than or less than this length, it is shown that attenuation is increased and resonance attenuation is degraded.

Also, when considering a ratio ($W_e/I_s$) of the length ($W_e$) of the portion of the second electrode 125a to the length ($I_s$) of the inclined surface of the inclined portion 1231 of the piezoelectric layer 123 in the extending portion E, it can be seen that attenuation is maintained over 37 dB in a case in which the ratio ($W_e/I_s$) is 0.46 to 0.69 as illustrated in FIG. 11 and presented in Table 1.

Therefore, in order to secure resonance attenuation, the acoustic resonator 100 according to the first example, may limit the ratio ($W_e/I_s$) of the maximum length ($W_e$) of the portion of the second electrode 125a and the length ($I_s$) of the inclined surface of the inclined portion 1231 in the extending portion E to the range of 0.46 to 0.69. However, the entire configuration of the present disclosure is not limited to the above-mentioned range, and the above-mentioned range may be changed depending on a size of the inclined angle θ or a change in the thickness of the insertion layer 170, and may also be changed as a resonance frequency of the resonator is changed.

In a case in which the acoustic resonator is used in a humid environment or left at room temperature for a long time, a problem that frequency fluctuation is increased or performance of the resonator is degraded has occurred by mass loading caused by a hydroxy group (OH group) adsorbed onto the protective layer of the acoustic resonator.

Figure 16:
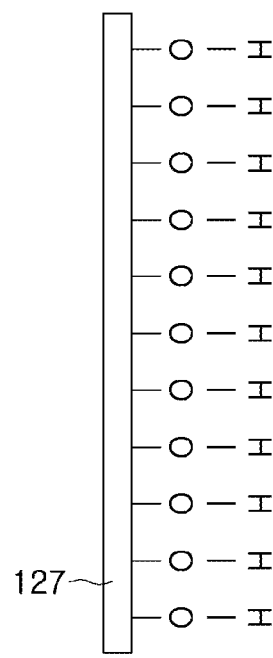
FIG. 16 illustrates a hydroxy group adsorbed onto a protective layer on which the hydrophobic layer is not formed.
Figure 19:
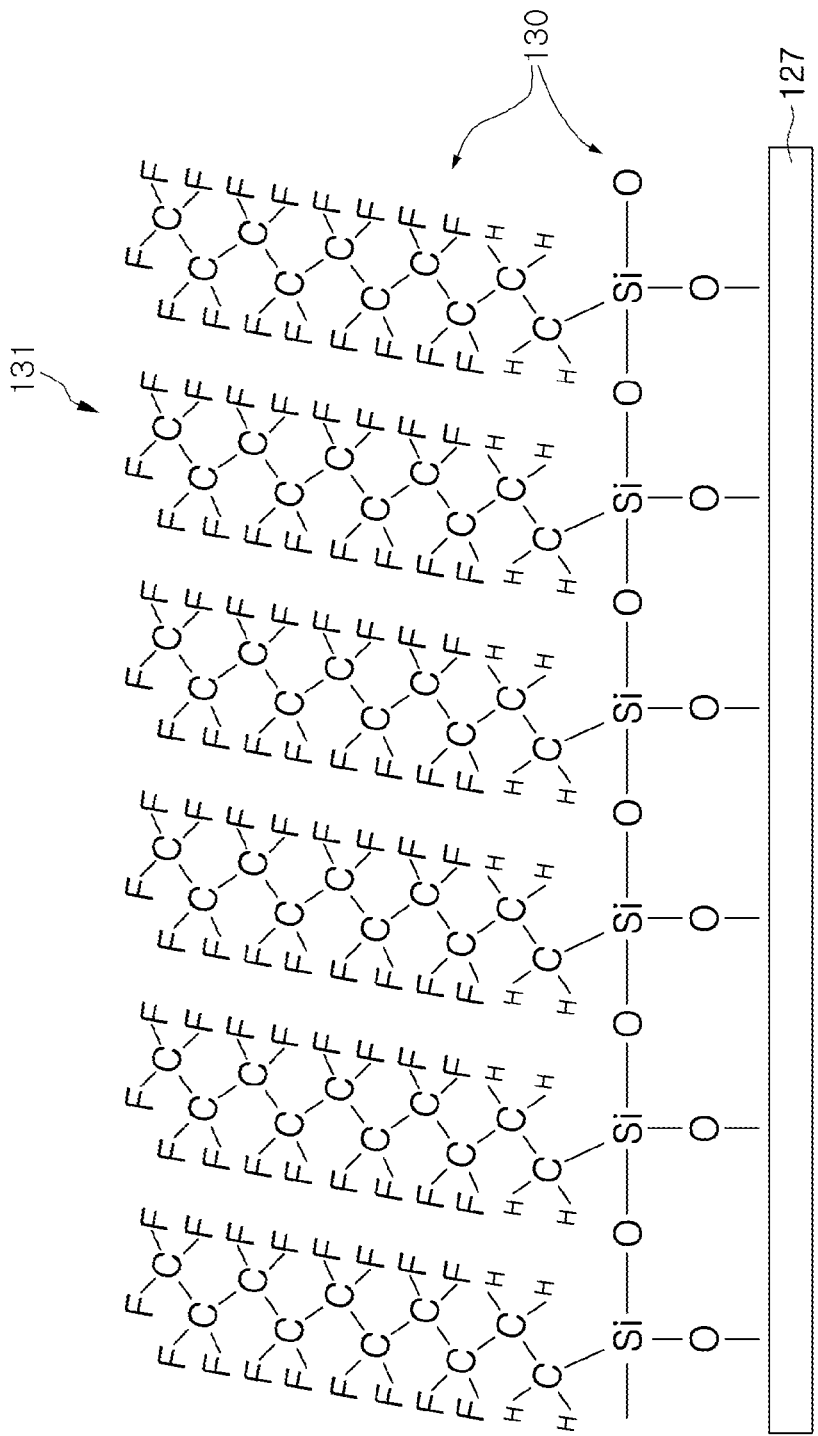
FIG. 19 illustrates the hydrophobic layer formed on the protective layer.

FIG. 16 illustrates a hydroxy group adsorbed onto a protective layer on which the hydrophobic layer is not formed and FIG. 19 illustrates the hydrophobic layer formed on the protective layer.

Referring to FIG. 16, in a case in which the hydrophobic layer is not formed, when an acoustic resonator is used in a humid environment or left at room temperature for a long time, hydroxylate may be formed due to the hydroxy group (OH group) adsorbed onto the protective layer. Since the hydroxylate has high and unstable surface energy, it attempts to decrease the surface energy by adsorbing water or the like, thereby resulting in the mass loading.

On the other hand, referring to FIG. 19, in a case in which the hydrophobic layer 130 is formed on the protective layer 127, since the surface energy is low and stable, the hydroxylate does not need to decrease the surface energy by adsorbing water and the hydroxyl group (OH group). Therefore, the hydrophobic layer 130 may serve to prevent the water and the hydroxy group (OH group) from being adsorbed, thereby significantly reducing frequency fluctuation and uniformly maintaining performance of the resonator.

Figure 18:
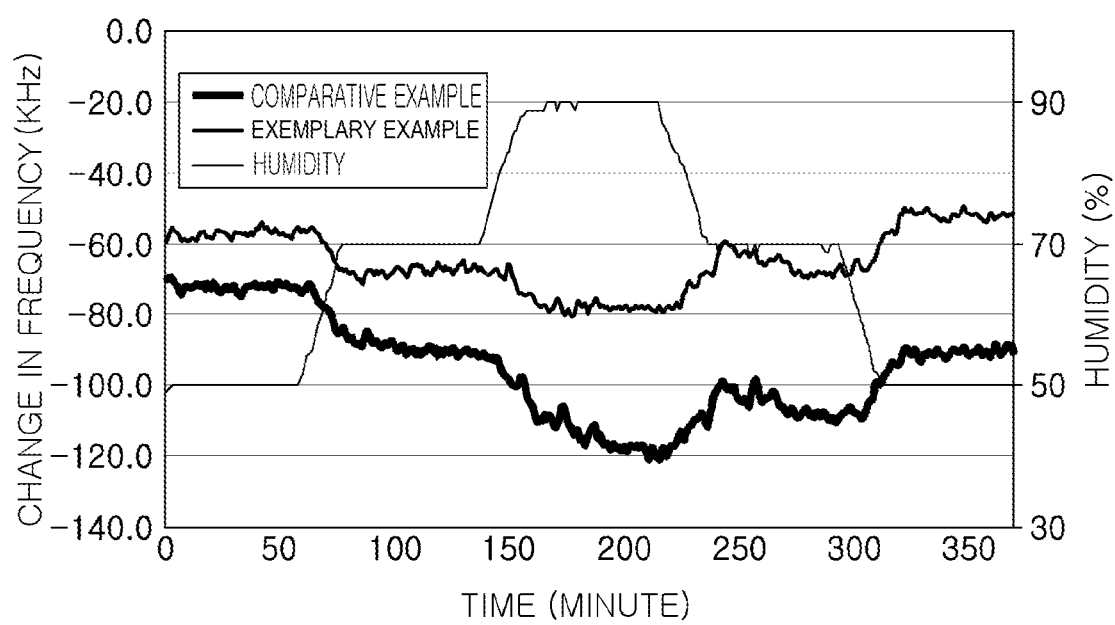
FIG. 18 is a graph illustrating a change in a frequency according to humidity and time for an acoustic resonator (Exemplary Example) in which the hydrophobic layer is formed on the protective layer and an acoustic resonator (Comparative Example) in which the hydrophobic layer is not formed on the protective layer.

FIG. 18 is a graph illustrating a change in a frequency according to humidity and time for an exemplary example of the acoustic resonator in which the hydrophobic layer is formed on the protective layer and a comparative example of an acoustic resonator in which the hydrophobic layer is not formed on the protective layer. In an experiment method, the exemplary example and the comparative example are placed in a moisture absorption chamber and a change in frequency was measured while changing humidity as illustrated in FIG. 18.

to the experimental results shown in FIG. 18, confirm that the acoustic resonator in which the hydrophobic layer is formed on the protective layer has much less frequency variation according to a change in humidity and time. Further, the exemplary example has a frequency variation at the time of ending of the experiment which is less than the frequency variation at the time of starting of the experiment.

Figure 12A:
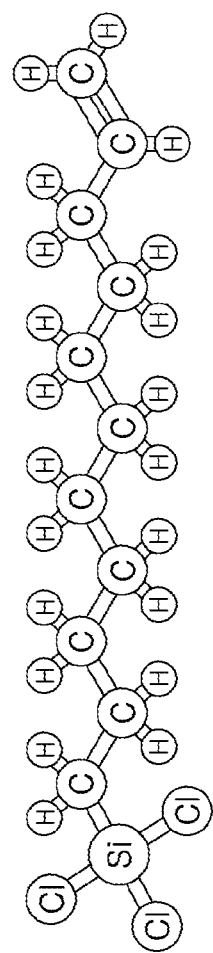
FIGS. 12A and 12B schematically illustrate example molecular structures of precursors used as an adhesion layer of a hydrophobic layer.
Figure 12B:
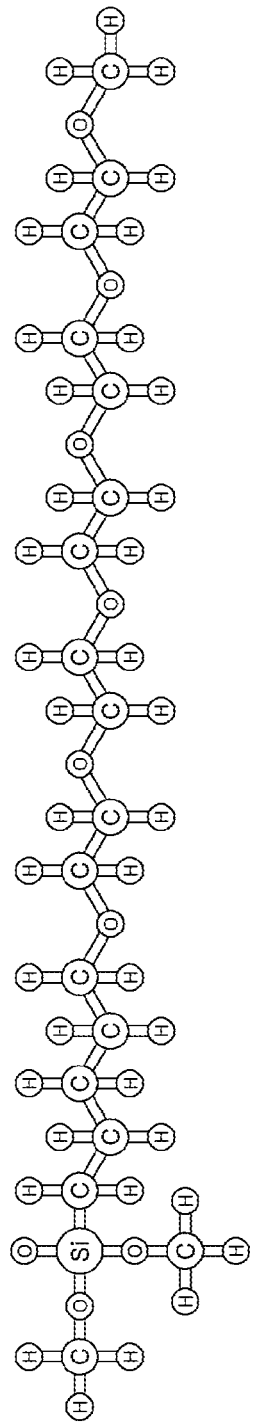

In an example, to improve adhesion between the hydrophobic layer 130 and the protective layer 127, a precursor is used. Referring to FIGS. 12A and 12B, the precursor may be a hydrocarbon having a silicon head, or a siloxane having a silicon head.

Figure 13:
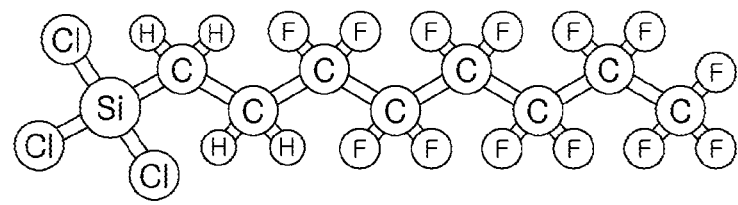
FIG. 13 schematically illustrates an example of a molecular structure of the hydrophobic layer.

Referring to FIG. 13, the hydrophobic layer 130 may be a fluorocarbon such as perfluorodecyltrichlorosilane, but is not limited thereto, and may be formed of a material having a contact angle of 90° or more by water after deposition. For example, the hydrophobic layer 130 includes a fluorine (F) component, and for example, the hydrophobic layer includes fluorine (F) and silicon (Si). For example, the hydrophobic layer 130 may be heptadecafluorodecyltrimethoxysilane, (heptafluoroisopropoxy)propyltrichlorosilane, octadecyldimethylchlorosilane, octadecyltrichlorosilane, tris(trimethylsiloxy)-silylethyldimethylchlorosilane, octyldimethylchlorosilane, dimethyldichlorosilane, butyldimethylchlorosilane, or trimethylchlorosilane.

The hydrophobic layer 130 may be formed of a self-assembled monolayer (SAM) 131, not a polymer. In a case in which the hydrophobic layer 130 is formed of a polymer, mass due to the polymer may affect the resonating portion 120. However, since the first example of the acoustic resonator 100 has the hydrophobic layer 130 formed of the self-assembled monolayer 131, the change in the frequency of the acoustic resonator 100 may be significantly reduced.

Further, in a case in which the hydrophobic layer 130 is formed of a polymer, when the hydrophobic layer is formed in the cavity C through the injection hole H (FIGS. 1 and 3), a thickness of the hydrophobic layer in the cavity C may become non-uniform. The thickness of the hydrophobic layer in the vicinity of the injection hole H in the cavity C may be greater than the thickness of the hydrophobic layer formed on the center portion of the cavity C which is remote from the injection hole H. However, since the hydrophobic layer 130 according to the example is formed of the self-assembled monolayer 131, the thickness of the hydrophobic layer is uniform regardless of the position in the cavity C.

Since the hydrophobic layer 130 is formed after a first metal layer 180 and a second metal layer 190 are formed as described below, the hydrophobic layer 130 may be formed on the protective layer 127 other than portions on which the first metal layer 180 and the second metal layer 190 are formed.

Further, the hydrophobic layer 130 may also be disposed on an upper surface of the cavity C, other than the protective layer. As described below, the hydrophobic layer may be formed on the upper surface of the cavity simultaneously with the hydrophobic layer on the protective layer in the operation of forming the hydrophobic layer on the protective layer, and the hydrophobic layer in the cavity C may be formed on at least a portion of a lower surface and a side surface of the cavity C as well as on the upper surface of the cavity C.

Since the resonating portion 120 is disposed on the cavity C, the upper surface of the cavity C may also affect the change in the frequency of the acoustic resonator. Therefore, in a case in which the hydrophobic layer is formed on the upper surface of the cavity C, the change in the frequency of the acoustic resonator may be significantly reduced.

Filter

Figure 14:
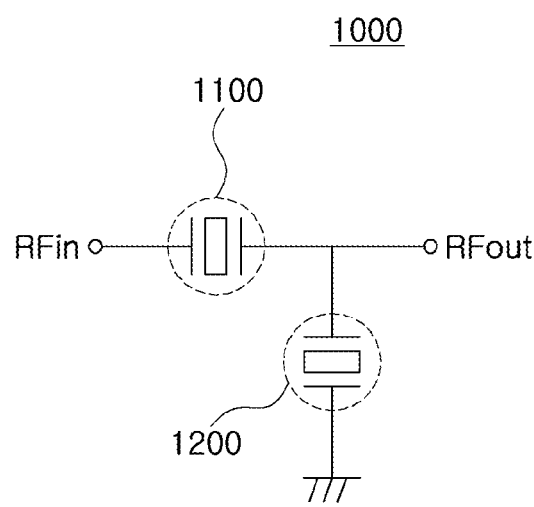
FIGS. 14 and 15 are schematic circuit diagrams of example filters.
Figure 15:
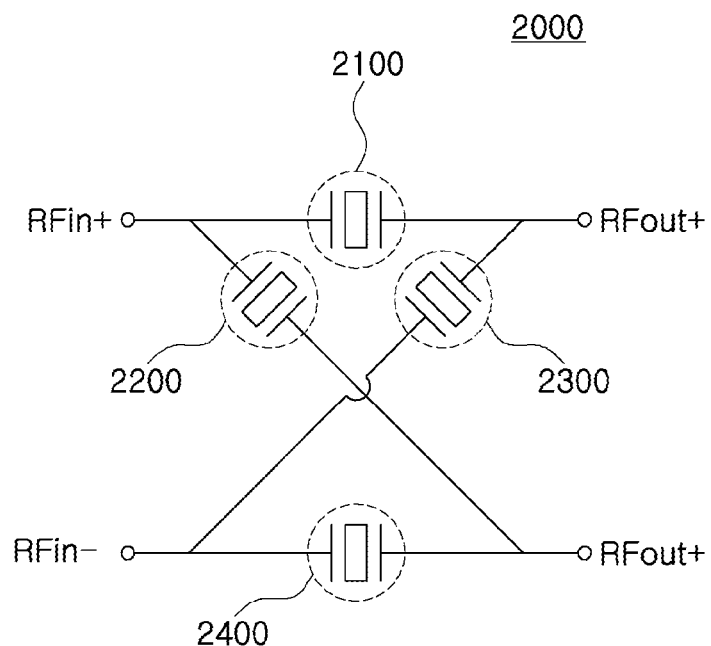

FIG. 14 is a schematic circuit diagram of a first example of a filter. FIG. 15 is a schematic circuit diagram of a second example of a filter.

Each of a plurality of bulk acoustic resonators employed in the filters of FIGS. 14 and 15 may correspond to the first example of an acoustic resonator illustrated in FIGS. 1-4 and described above, as well as, a second example of an acoustic resonator illustrated in FIGS. 9 and 10.

Referring to FIG. 14, a filter 1000 according to the first example of a filter is formed in a ladder type filter structure. Specifically, the filter 1000 includes a first acoustic resonator 1100 and a second acoustic resonator 1200.

A first acoustic resonator 1100 is connected in series between a signal input terminal to which an input signal RFin is input and a signal output terminal from which an output signal RFout is output, and a second acoustic resonator 1200 is connected between the signal output terminal and a ground.

Referring to FIG. 15, a filter 2000 according to the second example of a filter is formed in a filter structure of a lattice type. Specifically, the filter 2000 includes a third acoustic resonator 2100, a fourth acoustic resonator 2200, a fifth acoustic resonator 2300, and a sixth acoustic resonator 2400 to filter balanced input signals RFin+ and RFin− and to output balanced output signals RFout+ and RFout−.

Further, a third example of a filter may be formed in a filter structure in which the filter structure of the ladder type of FIG. 14 and the filter structure of the lattice type of FIG. 15 are combined.

Method for Manufacturing Acoustic Resonator

Next, an example method for manufacturing an acoustic resonator will be described.

FIGS. 5 through 8 are views illustrating an example method for manufacturing an acoustic resonator.

Figure 5:
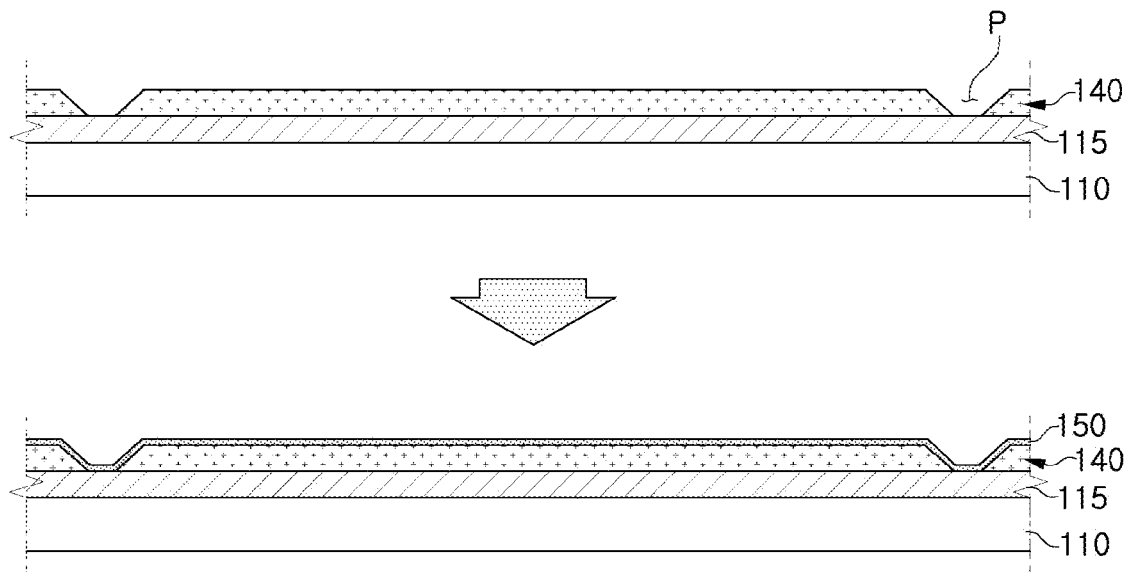
FIGS. 5, 6, 7, and 8 are cross-sectional views illustrating an example method for manufacturing an example acoustic resonator.

Referring to FIG. 5, in the example method for manufacturing the acoustic resonator, the insulating layer 115 and the sacrificial layer 140 are formed on the substrate 110, and a pattern P penetrating through the sacrificial layer 140 is formed. Therefore, the insulating layer 115 is exposed to the outside through the pattern P.

The insulating layer 115 may be formed of magnesium oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), zinc oxide (ZnO), silicon nitride ($Si_3N_4$), silicon dioxide ($SiO_2$), or the like, but are not limited thereto.

The pattern P formed in the sacrificial layer 140 may have a cross section of a trapezoidal shape in which a width of an upper surface is greater than a width of a lower surface.

The sacrificial layer 140 is partially removed by a subsequent etching process to form the cavity C (FIG. 2). Therefore, the sacrificial layer 140 may be formed of a material such as polysilicon, polymer, or the like which may be easily etched. However, the material of the sacrificial layer 140 is not limited thereto.

The membrane layer 150 is formed on the sacrificial layer 140. The membrane layer 150 may have a constant thickness along a surface of the sacrificial layer 140. The thickness of the membrane layer 150 may be thinner than that of the sacrificial layer 140.

The membrane layer 150 may include at least one of silicon dioxide ($SiO_2$) and silicon nitride ($Si_3N_4$). Further, the membrane layer 150 may be formed of a dielectric layer containing at least one of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer containing at least one of aluminum (Al), nickel (Ni), chromium (Cr), platinum (Pt), gallium (Ga), and hafnium (Hf). However, the configuration of the present disclosure is not limited thereto.

A seed layer (not shown) may be formed on the membrane layer 150.

The seed layer may be disposed between the membrane layer 150 and the first electrode 121. The seed layer may be manufactured of aluminum nitride (AlN), but is not limited thereto, and may also be formed of a dielectric or a metal having an HCP structure. For example, in a case in which the seed layer is formed of a metal, the seed layer may be formed of titanium (Ti).

Figure 6:
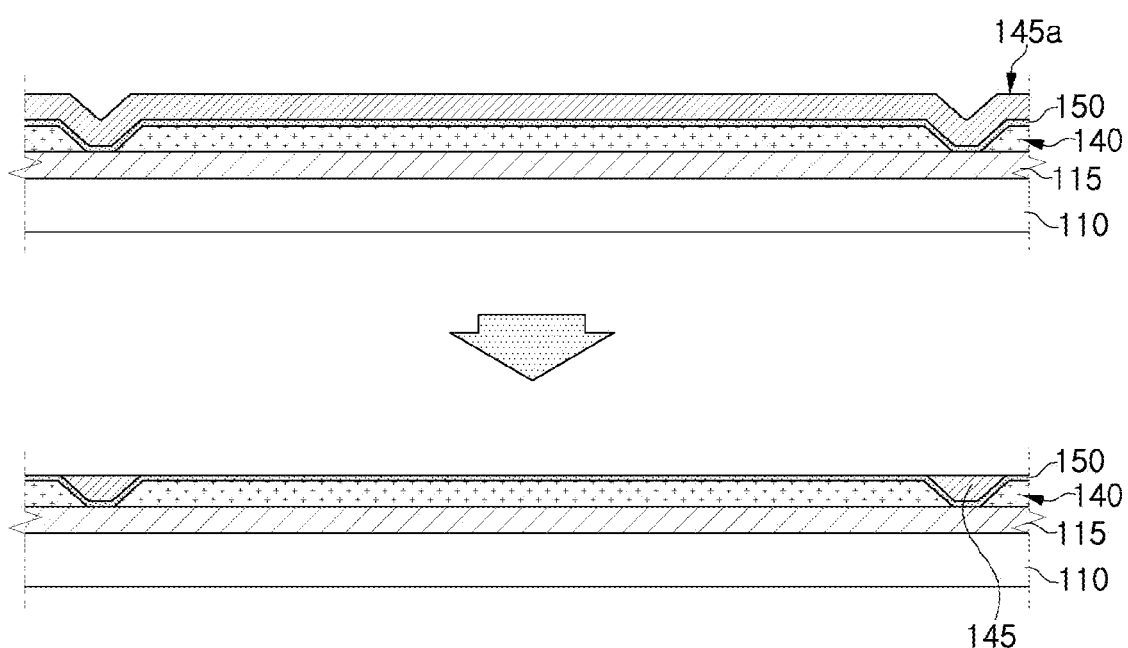

As illustrated in FIG. 6, the etching stop layer 145a is formed on the membrane layer 150. The etching stop layer 145a is also filled in the pattern P.

The etching stop layer 145a may have a thickness that completely fills the pattern P. Therefore, the etching stop layer 145a may have a greater thickness than the sacrificial layer 140.

The etching stop layer 145a may be formed of the same material as the insulating layer 115, but is not limited thereto.

The etching stop layer 145a is removed so that the membrane layer 150 is exposed to the outside.

Here, the portion of the etching stop layer 145a filled in the pattern P is left, and the left etching stop layer 145a serves as the etching stop part 145.

Figure 7:
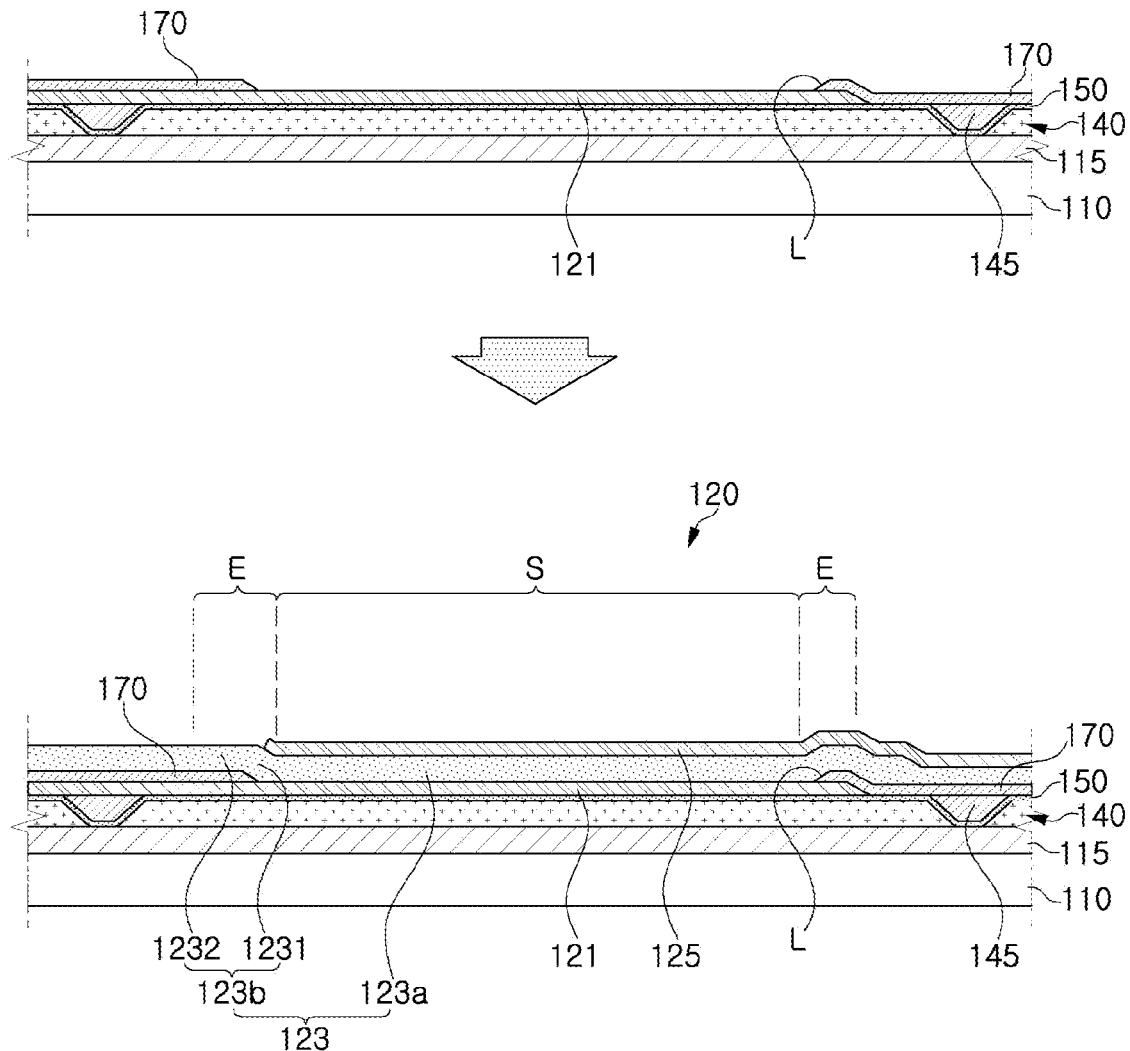

As illustrated in FIG. 7, the first electrode 121 is formed on the membrane layer 150.

The first electrode 121 is formed of a conductor, and may be formed of, for example, gold, molybdenum, ruthenium, iridium, aluminum, platinum, titanium, tungsten, palladium, tantalum, silver, copper, chromium, nickel, or a metal including at least one thereof, but is not limited thereto.

The first electrode 121 is formed on a region in which the cavity C (FIG. 3) is formed.

The first electrode 121 may be formed by forming a conductor layer on the entirety of the membrane layer 150 and then removing an unnecessary portion.

The insertion layer 170 may be formed as needed. The insertion layer 170 is formed on the first electrode 121 and may be extended upwardly from the membrane layer 150 as needed. When the insertion layer 170 is formed, since the extending portion E of the resonating portion 120 has a greater thickness than the center portion S, Q-factor of the acoustic resonator 100 may be increased by suppressing vibration generated at the center portion S from escaping to the extending portion E.

The insertion layer 170 may be disposed by covering the entirety of the surface formed by the membrane layer 150, the first electrode 121, and the etching stop layer 145 and removing a portion disposed on a region corresponding to the center portion S.

Accordingly, a central portion of the first electrode 121 configuring the center portion S is exposed to the outside of the insertion layer 170. Further, the insertion layer 170 covers a portion of the first electrode 121 along a perimeter of the first electrode 121. Therefore, an edge portion of the first electrode 121 disposed on the extending portion E may be disposed below the insertion layer 170.

A side surface of the insertion layer 170 disposed to be adjacent to the center portion S is formed as an inclined surface L. The insertion layer 170 is thinner toward the center portion S, and accordingly, the lower surface of the insertion layer 170 extends further toward the center portion S than an upper surface of the insertion layer 170. Here, the inclined angle of the inclined surface L of the insertion layer 170 is in the range of about 5° to about 70°, as described above.

The insertion layer 170 may be formed of, for example, a dielectric such as silicon dioxide ($SiO_2$), aluminum nitride (AlN), aluminum oxide ($Al_2O_3$), silicon nitride ($Si_3N_4$), magnesium oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material different from the piezoelectric layer 123.

The piezoelectric layer 123 is formed on the first electrode 121 and the insertion layer 170.

The piezoelectric layer 123 may be formed of aluminum nitride (AlN). However, the piezoelectric layer 123 is not limited thereto and as a material of the piezoelectric layer 123, zinc oxide (ZnO), doped aluminum nitride, lead zirconate titanate, quartz, and the like may be selectively used. Further, the doped aluminum nitride may further include a rare earth metal or a transition metal. As an example, the rare earth metal may include at least one of scandium (Sc), erbium (Er), yttrium (Y), cerium (Ce), and lanthanum (La). The transition metal may include at least one of hafnium (Hf), titanium (Ti), zirconium (Zr), tantalum (Ta), niobium (Nb), and magnesium (Mg).

Further, the piezoelectric layer 123 may be formed of a same material as the insertion layer 170 or a material different from the insertion layer 170.

The piezoelectric layer 123 may be disposed by forming a piezoelectric material on the entirety of the surface formed by the first electrode 121 and the insertion layer 170 and then partially removing an unnecessary portion. The piezoelectric layer 123 may be completed by forming the second electrode 125 and then removing an unnecessary portion of the piezoelectric material. However, forming the piezoelectric layer 123 is not limited thereto, but may alternatively be completed before the second electrode 125 is formed.

The piezoelectric layer 123 partially covers the first electrode 121 and the insertion layer 170, and accordingly, the piezoelectric layer 123 is formed along an edge of the surface formed by the first electrode 121 and the insertion layer 170.

As described above, only a portion of the first electrode 121 corresponding to the center portion S may be exposed to the outside of the insertion layer 170. Therefore, the piezoelectric layer 123 formed on the first electrode 121 may be disposed in the center portion S. In addition, the bending portion 123b formed on the insertion layer 170 is disposed in the extending portion E.

The second electrode 125 is formed on the piezoelectric layer 123. The second electrode 125 is formed of a conductor, and may be formed of, for example, gold, molybdenum, ruthenium, iridium, aluminum, platinum, titanium, tungsten, palladium, tantalum, silver, copper, chromium, nickel, or a metal including at least one thereof, but is not limited thereto.

The second electrode 125 may be basically formed on the piezoelectric portion 123a of the piezoelectric layer 123. As described above, the piezoelectric portion 123a of the piezoelectric layer 123 is disposed in the center portion S. Therefore, the second electrode 125 disposed on the piezoelectric layer 123 is also disposed in the center portion S.

Further, the second electrode 125 is also formed on the inclined portion 1231 of the piezoelectric layer 123. Accordingly, as described above, the second electrode 125 is disposed in the center portion S and the extending portion E. The second electrode 125 may be partially disposed in the extending portion E, thereby providing remarkably improved resonance attenuation.

Figure 8:
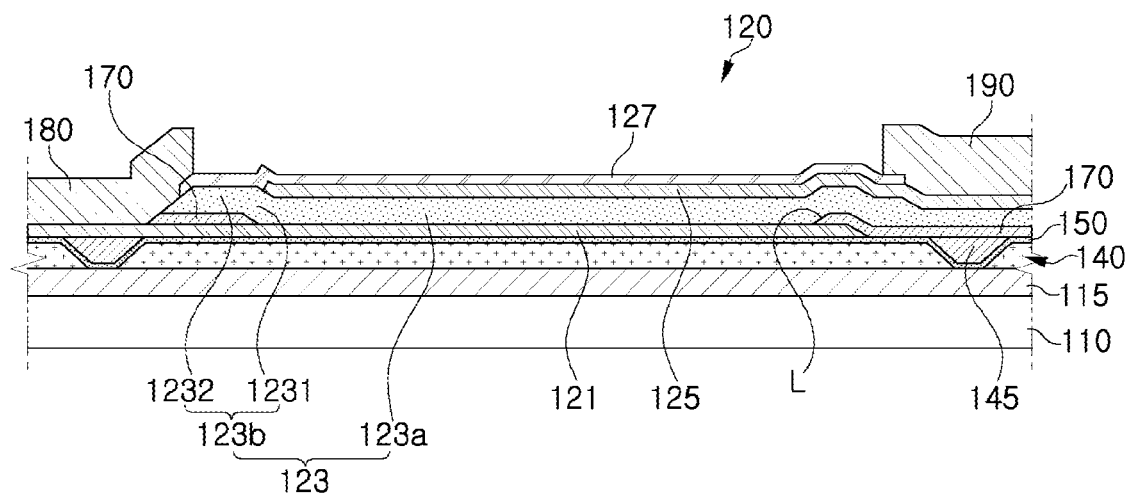

As illustrated in FIG. 8, the protective layer 127 is formed.

The protective layer 127 is formed along a surface formed by the second electrode 125 and the piezoelectric layer 123. Further, although not illustrated, the protective layer 127 may also be formed on the insertion layer 170 which is exposed to the outside.

The protective layer 127 is formed of an insulating material such as silicon oxide based insulating material, silicon nitride based insulating material, and aluminum nitride based insulating material, but is not limited thereto.

The first electrode 121 and the second electrode 125 are partially exposed by partially removing the protective layer 127 and the piezoelectric layer 123, and the first metal layer 180 and the second metal layer 190 are each formed on the exposed portions. That is, the first metal layer 180 is formed on the exposed portion of the first electrode 121 and the second metal layer 190 is formed on the exposed portion of the second electrode 125.

The first metal layer 180 and the second metal layer 190 may be formed of materials such as gold (Au), a gold-tin (Au—Sn) alloy, copper (Cu), a copper-tin (Cu—Sn) alloy, and the like, and may be formed to be deposited on the first electrode 121 or the second electrode 125, but are not limited thereto.

The cavity C is formed by removing a portion of the sacrificial layer 140 disposed in the etching stop part 145, and the sacrificial layer 140 removed during this process may be removed by an etching manner.

In a case in which the sacrificial layer 140 is formed of a material such as polysilicon, polymer, or the like, the sacrificial layer 140 may be removed by a dry etching method using a halide-based etching gas (for example, $XeF_2$) such as fluorine (F), chlorine (Cl), and the like.

A trimming process using a wet process is performed to obtain desired frequency characteristics.

Manufacturing of the first example acoustic resonator 100 illustrated in FIGS. 1-4 and the second example acoustic resonator 100 illustrated in FIGS. 9 and 10, includes forming the hydrophobic layer 130 on the protective layer 127.

The hydrophobic layer 130 is formed by depositing a hydrophobic material by a chemical vapor deposition (CVD) method.

Figure 17:
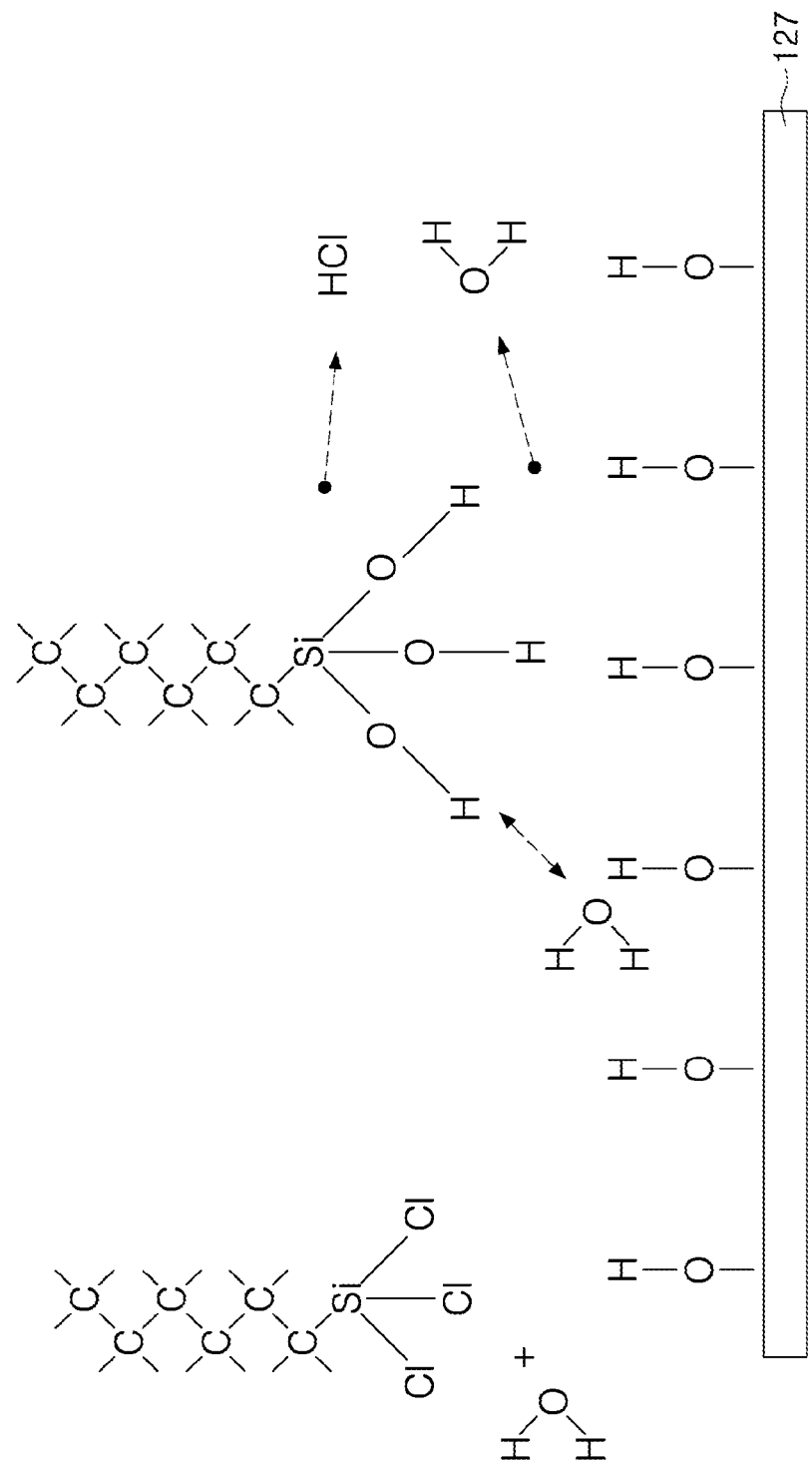
FIG. 17 schematically illustrates a process of forming a hydrophobic layer on a protective layer in an example method for manufacturing an example acoustic resonator.

For example, hydroxylate may be formed on a surface of the protective layer 127 formed of $SiO_2$ as illustrated in FIG. 17. The surface of the protective layer 127 may be surface-treated by performing a silane hydrolysis reaction for such hydroxylate using a precursor having a silicon head.

Thereafter, the hydrophobic layer 130 may be formed on the protective layer 127 as illustrated in FIG. 19 by forming a fluorocarbon functional group on the surface-treated surface of the protective layer.

Alternatively, the hydrophobic layer 130 may be formed by omitting the surface treatment depending on the material of the protective layer, and forming the fluorocarbon functional group on the protective layer 127.

In the operation of forming the hydrophobic layer described above, the hydrophobic layer may also be formed on the upper surface of the cavity C through the injection hole H (FIGS. 1 and 3), the hydrophobic layer may also be formed on at least a portion of a lower surface and a side surface of the cavity C as well as the upper surface of the cavity C, and the hydrophobic layer may also be formed on the entirety of the upper, lower, and side surfaces of the cavity C.

Further, the hydrophobic layer 130 is formed of the self-assembled monolayer 131, not the polymer, thereby preventing mass loading due to the hydrophobic layer 130 from being applied to the resonating portion 120. The hydrophobic layer 130 formed of the self-assembled monolayer 131 provides a uniform thickness of the hydrophobic layer 130.

According to the examples described above, a hydrophobic layer is disposed on a protective layer, whereby frequency fluctuation may be significantly reduced and performance of a resonator may be uniformly maintained even when the acoustic resonator is used in a humid environment or left at room temperature for a long time.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
   a membrane layer disposed on an insulating layer;
   a cavity formed by the insulating layer and the membrane layer;
   a resonating portion disposed on the cavity and comprising a first electrode, a piezoelectric layer, and a second electrode stacked thereon;
   a protective layer disposed on the resonating portion; and
   a hydrophobic layer disposed on the protective layer,
   wherein the protective layer is disposed between the hydrophobic layer and the second electrode.

2. The acoustic resonator of claim 1, wherein the hydrophobic layer is further disposed on an upper surface of the cavity.

3. The acoustic resonator of claim 2, wherein the hydrophobic layer is further disposed on at least a portion of a lower surface and a side surface of the cavity.

4. The acoustic resonator of claim 1, wherein the hydrophobic layer is a self-assembled monolayer.

5. The acoustic resonator of claim 1, wherein the hydrophobic layer comprises a fluorine (F) component.

6. The acoustic resonator of claim 5, wherein the hydrophobic layer further comprises a silicon (Si) component.

7. The acoustic resonator of claim 1, wherein the resonating portion comprises a center portion, and an extending portion extending outward from the center portion and in which an insertion layer is disposed below the piezoelectric layer, and
   wherein the piezoelectric layer comprises a piezoelectric portion disposed in the center portion, and a bending portion disposed in the extending portion and extending inclined from the piezoelectric portion along an edge of the insertion layer.

8. The acoustic resonator of claim 1, further comprising an insertion layer disposed below the piezoelectric layer,
   wherein the insertion layer comprises an inclined surface having a thickness that increases as a distance from a center portion of the piezoelectric layer increases.

* * * * *